(12) United States Patent
Roldan et al.

(10) Patent No.: US 11,432,401 B2
(45) Date of Patent: Aug. 30, 2022

(54) ELECTRONIC ASSEMBLY AND AUTOMOTIVE LUMINOUS DEVICE

(71) Applicant: VALEO VISION, Bobigny (FR)

(72) Inventors: Jose-David Roldan, Martos (ES); Miguel Angel Cantudo, Martos (ES); Alvaro Andres, Martos (ES); Thibault Menn, Bobigny (FR)

(73) Assignee: Valeo Vision, Bobigny (FR)

( * ) Notice: Subject to any disclaimer, the term of this patent is extended or adjusted under 35 U.S.C. 154(b) by 4 days.

(21) Appl. No.: 17/043,572

(22) PCT Filed: Mar. 29, 2019

(86) PCT No.: PCT/EP2019/058056
§ 371 (c)(1),
(2) Date: Sep. 29, 2020

(87) PCT Pub. No.: WO2019/185892
PCT Pub. Date: Oct. 3, 2019

(65) Prior Publication Data
US 2021/0022244 A1 Jan. 21, 2021

(30) Foreign Application Priority Data
Mar. 29, 2018 (EP) .................... 18382225

(51) Int. Cl.
*H05K 1/00* (2006.01)
*H05K 1/05* (2006.01)
(Continued)

(52) U.S. Cl.
CPC .............. *H05K 1/05* (2013.01); *F21S 41/141* (2018.01); *F21S 43/14* (2018.01); *F21S 45/47* (2018.01);
(Continued)

(58) Field of Classification Search
CPC ......... H05K 2201/09018; H05K 1/118; H05K 1/05; H05K 1/189; H05K 1/0277;
(Continued)

(56) References Cited

U.S. PATENT DOCUMENTS 8,242,475 B1 *  8/2012  Cheng ................... A45D 31/00
                                                 250/504 R
8,450,705 B1 *  5/2013  Chen ....................... F26B 3/28
                                                 250/492.1
(Continued)

FOREIGN PATENT DOCUMENTS

FR          3026467 A1    4/2016
WO      2017116142 A1    7/2017

OTHER PUBLICATIONS

European Patent Office, International Search Report and Written Opinion of International Application No. PCT/EP2019/058056, dated Jul. 26, 2019.
(Continued)

*Primary Examiner* — Gerald J Sufleta, II
(74) *Attorney, Agent, or Firm* — Valeo Vision

(57) ABSTRACT

The invention is related to an electronic assembly comprising a printed circuit board and an electronic component. The printed circuit board comprises a first side and a second side opposite to the first side. The electronic component is installed in the first side of the printed circuit board. The printed circuit board is an insulated metal substrate printed circuit board and comprises a bending portion which divides the printed circuit board into a first main portion and a second main portion, the electronic component being located in the first main portion. The first and second main portions are not comprised in a common plane.

14 Claims, 2 Drawing Sheets

(51) Int. Cl.
*F21S 43/14* (2018.01)
*F21S 41/141* (2018.01)
*F21S 45/47* (2018.01)
*H05K 1/02* (2006.01)
*H05K 1/18* (2006.01)
*F21Y 115/10* (2016.01)

(52) U.S. Cl.
CPC ......... *H05K 1/0203* (2013.01); *H05K 1/0277* (2013.01); *H05K 1/181* (2013.01); *F21Y 2115/10* (2016.08); *H05K 2201/10106* (2013.01)

(58) Field of Classification Search
CPC ....... H05K 1/0278; H05K 1/028; F21S 43/14; F21S 41/141
See application file for complete search history.

(56) References Cited

U.S. PATENT DOCUMENTS

| | | |
|---|---|---|
| 2008/0247177 A1 | 10/2008 | Tanaka et al. |
| 2009/0090928 A1 | 4/2009 | Mori et al. |
| 2011/0277338 A1* | 11/2011 | Li .............. G21K 5/08 34/275 |
| 2014/0036497 A1* | 2/2014 | Hussell ............ F21V 23/06 362/235 |
| 2014/0153245 A1* | 6/2014 | Horvath .......... H05K 1/0203 362/249.06 |
| 2015/0300609 A1* | 10/2015 | Hu .............. F21V 19/0015 362/97.1 |
| 2016/0170218 A1* | 6/2016 | Johnson ........... G02B 7/1824 359/356 |
| 2017/0299143 A1* | 10/2017 | Mornet ............ B60Q 1/0088 |
| 2018/0209604 A1 | 7/2018 | Kim |
| 2018/0302973 A1* | 10/2018 | Pena .............. B60Q 1/20 |
| 2018/0363893 A1* | 12/2018 | Cheng ............ F21V 29/87 |

OTHER PUBLICATIONS

European Patent Office, Extended European Search Report of European Application No. 18382225.3-1202, dated Oct. 4, 2018.
European Patent Office, Communication from the Examining Division of corresponding European application No. EP3547806, dated Nov. 23, 2021.

* cited by examiner

ELECTRONIC ASSEMBLY AND AUTOMOTIVE LUMINOUS DEVICE

CROSS-REFERENCE TO RELATED APPLICATIONS

This application is filed under 35 U.S.C. § 371 U.S. National Phase of International Application No. PCT/EP2019/058056 filed Mar. 29, 2019 (published as WO2019185892), which claims foreign priority benefit to European application No. 18382225.3 filed on Mar. 29, 2018, the disclosures of which are herein incorporated by reference in their entirety.

TECHNICAL FIELD

This invention is related to the field of heat dissipation in automotive luminous devices.

BACKGROUND

Light sources generate a big amount of heat, which needs to be dissipated, so that the operation of said light sources is not jeopardized. This issue is even more important when light sources are light emitting diodes (LEDs), since temperature has a big impact on the operational properties of said light sources.

Heatsinks are known to solve this problem. A heatsink is located in thermal contact with the light source, and this heatsink is provided with fins or any other suitable element, which dissipate the heat coming from the heatsink by convection or radiation, so that air surrounding the heater is heated and then wasted.

Heatsinks are usually glued to the PCB where the LEDs are installed, using a glue which is thermally conductive. With this arrangement, heat is transferred from the PCB to the heatsink and then dissipated by the fins.

Another option is arranging the heater outside the luminous device, but heat transfer is more difficult. Heat pipes are usually used, such as in document US 2008/247177 A1. A lighting element connected to a heat pipe is less versatile, since heat pipes do not usually allow a free movement of the associated element.

SUMMARY

The invention provides an alternative solution for providing by means of an automotive luminous device according to claim 1. Preferred embodiments of the invention are defined in dependent claims.

In a first inventive aspect, the invention provides an electronic assembly comprising
a printed circuit board with a first side and a second side opposite to the first side; and
an electronic component installed in the first side of the printed circuit board;
wherein the printed circuit board is an insulated metal substrate printed circuit board and
comprises a first bending portion which divides the printed circuit board into a first main portion and a second main portion, the electronic component being located in the first main portion, and wherein the first and second main portions are not comprised in a common plane.

Advantageously, the first bending portion makes the printed circuit board work as a heatsink, since the two portions make the printed circuit board a non-plane element, thus making heat transferring easier between the printed circuit board itself and the surrounding fluid. Further, integration in an automotive vehicle luminous device is also easier, since the shape of the bent printed circuit board is similar to the shape of the heatsinks which are currently used.

Further, the fact that there is a first bending portion that causes two main portions does not exclude the presence of more bending portions causing more main portions. In some particular embodiments, the electronic component is a semiconductor light source, such as a light emitting diode (LED). This feature makes this electronic component usable in automotive luminous devices.

In some particular embodiments, the first bending portion is such that the first side of the first main portion is bent over the first side of the second main portion. According to this embodiment, the first side is made substantially concave and the second side is made substantially convex. This configuration is advantageous in manufacturing the electronic assembly, since the printed circuit board may be first bent and then the electronic component may be installed in the first side.

In some particular embodiments, the two main portions form an angle between 80 and 100 degrees.

Such an electronic assembly has an improved thermal behavior, since the heat path takes advantage of the substantially 90-degree angle and heat is dissipated from the first main portion to a second main portion which, according to this angle, is normally arranged vertical, thus taking advantage of gravity in the convection phenomenon.

In some particular embodiments, the second main portion further comprises at least a second bending portion, which divides the second main portion in at least two secondary portions. Further bending portions, located in the second main portion, improves heat dissipation. More particularly, a second bending portion is such that the second side of a secondary main portion is bent over the second side of the other secondary portion. This embodiment offers a still better thermal behavior.

In some particular embodiments, the printed circuit board comprises conductive tracks which are arranged only in the first main portion of the printed circuit board, and not in the first bending portion or in the second main portion.

This embodiment avoids the risk of damaging the conductive tracks when bending the printed circuit board.

In some particular embodiments, the printed circuit board comprises conductive tracks both in the first main portion, in the bending portion and in the second main portion, but the conductive tracks in the bending portion or in the second main portion are not electrically connected to the electronic component or are not functional.

In this case, even if the conductive tracks of the bending portion or the second portion are damaged, there is no bad consequence for the product.

In some particular embodiments, two of the secondary portions form an angle between 80 and 100 degrees.

Such an electronic assembly has an improved thermal behavior, since the heat path takes advantage of the substantially 90-degree angle and heat is dissipated from the second main portion in different planes.

In some particular embodiments, the first main portion comprises more than one first bending portions, in such a way that, further from a first main portion and a second main portion, third of more main portions may be created.

These embodiments increase the number of heat dissipation options, so that a combination of bending portions may be performed in order to adapt to the heat dissipation necessities of each electronic element.

In some particular embodiments, the first bending portion and/or one of the second bending portions has a radius of curvature which is greater than the thickness of the printed circuit board in the corresponding bending portion.

This feature ensures a good mechanical behavior of the printed circuit board, avoiding harmful stresses in any of the bending portions.

In some particular embodiments, the printed circuit board comprises a core made of a metal, such as copper or aluminum.

These materials are suitable for heat transferring, and are ductile enough to bend them without breakage.

In some particular embodiments, the printed circuit board comprises a flexible dielectric cover, made of an electrically insulating material, which provides electric insulation between the core and the conductive tracks.

This flexible cover ensures electric insulating between the circuit tracks and the core of the printed circuit board. In this document, the fact that an element is "flexible" should be understood as the property of this element of bending to make contact between opposite ends of this element without suffering a plastic deformation. The person skilled in the art knows this concept because it is used to distinguish between a "flexible" printed circuit board from a standard printed circuit board.

In some particular embodiments, the printed circuit board also comprises a protective solder mask, located over the conductive tracks.

In some particular embodiments, the printed circuit board is black, either because one of its components is black or because it has been painted of black. The printed circuit board or some of its elements, such as a protective solder mask which is located over the conductive tracks, may be painted or anodized to acquire a black color, which is advantageous to dissipate heat by radiation.

In a further inventive aspect, the invention is referred to an automotive luminous device comprising an electronic assembly according to the previous inventive aspect, wherein the electronic component is a semiconductor light source, such as a light emitting diode (LED); and a first optical element arranged to receive light from the semiconductor light source and to shape the light into a light pattern projected outside the luminous device.

This automotive luminous device is simpler to manufacture than current ones and have a fewer number of elements to be assembled.

An optical element is an element that has some optical properties to receive a light beam and emit it in a certain direction and/or shape, as a person skilled in automotive lighting would construe without any additional burden.

In some particular embodiments, the optical element is at least one of a light guide, a lens, a reflector or a collimator.

These optical elements are useful to manage the flux produced by the plurality of light sources and provide uniform output.

In some particular embodiments, the optical element supports the printed circuit board. In other particular embodiments, the printed circuit board supports the optical element.

BRIEF DESCRIPTION OF THE DRAWINGS

To complete the description and in order to provide for a better understanding of the invention, a set of drawings is provided. Said drawings form an integral part of the description and illustrate an embodiment of the invention, which should not be interpreted as restricting the scope of the invention, but just as an example of how the invention can be carried out. The drawings comprise the following figures.

DETAILED DESCRIPTION

Figure 1:
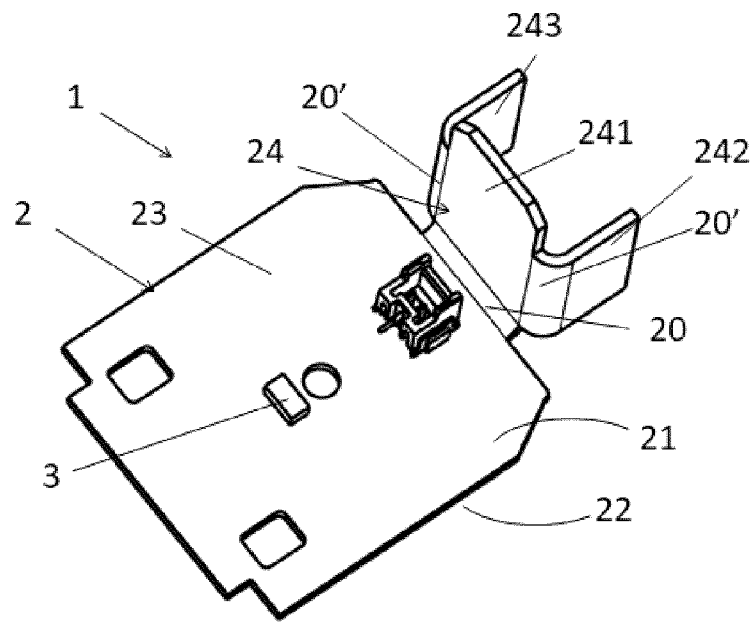
FIG. 1 shows a first embodiment of an electronic assembly according to the invention.

The example embodiments are described in sufficient detail to enable those of ordinary skill in the art to embody and implement the systems and processes herein described. It is important to understand that embodiments can be provided in many alternate forms and should not be construed as limited to the examples set forth herein.

Accordingly, while embodiment can be modified in various ways and take on various alternative forms, specific embodiments thereof are shown in the drawings and described in detail below as examples. There is no intent to limit to the particular forms disclosed. On the contrary, all modifications, equivalents, and alternatives falling within the scope of the appended claims should be included. Elements of the example embodiments are consistently denoted by the same reference numerals throughout the drawings and detailed description where appropriate.

Unless otherwise defined, all terms (including technical and scientific terms) used herein are to be interpreted as is customary in the art. It will be further understood that terms in common usage should also be interpreted as is customary in the relevant art and not in an idealized or overly formal sense unless expressly so defined herein.

In this text, the term "comprises" and its derivations (such as "comprising", etc.) should not be understood in an excluding sense, that is, these terms should not be interpreted as excluding the possibility that what is described and defined may include further elements, steps, etc.

FIG. 1 shows an electronic assembly 1 comprising a printed circuit board 2 with a first side 21 and a second side 22 opposite to the first side 21; and a LED 3 installed in the first side 21 of the printed circuit board 2.

The printed circuit board 2 is an insulated metal substrate printed circuit board and comprises a first bending portion 20 which divides the printed circuit board into a first main portion 23 and a second main portion 24, the LED 3 being located in the first main portion 23. The two main portions 23, 24 form an angle of substantially 90 degrees and the bending is made such that the first side of the first main portion 23 is bent over the first side of the second main portion 24.

With this bending in the printed circuit board, it works as a heatsink, the heat produced in the LED is transmitted through the bent printed circuit board due to the fact that it is an insulated metal substrate printed circuit board. As a consequence, there is no need to provide an additional heatsink.

For a better design, and in order to minimize operation failures, the conductive tracks of the printed circuit board are arranged only in the first main portion 23 of the printed circuit board, and not in the first bending portion 20 or in the second main portion 24.

In the embodiment shown in this figure, the second main portion further comprises two second bending portions 20', which divide the second main portion in three secondary portions 241, 242, 243: one of these secondary portions, 241, remains unchanged and the other two 242, 243 bend from the second bending portions 20', thus creating new fins. These second bending portions 20' are such that the second side of a secondary main portion which creates a fin is bent over the second side of the secondary portion which remains unchanged, thus achieving a compact structure but with a good ability to dissipate heat.

Since the insulated metal substrate printed circuit board comprises a core of a conductive ductile metal, such as copper or aluminum, these bends are easily to manufacture, and do not involve any risk of breaking the printed circuit board.

The printed circuit board also comprises a flexible cover, made of an electrically insulating material, such as silicone.

Figure 2:
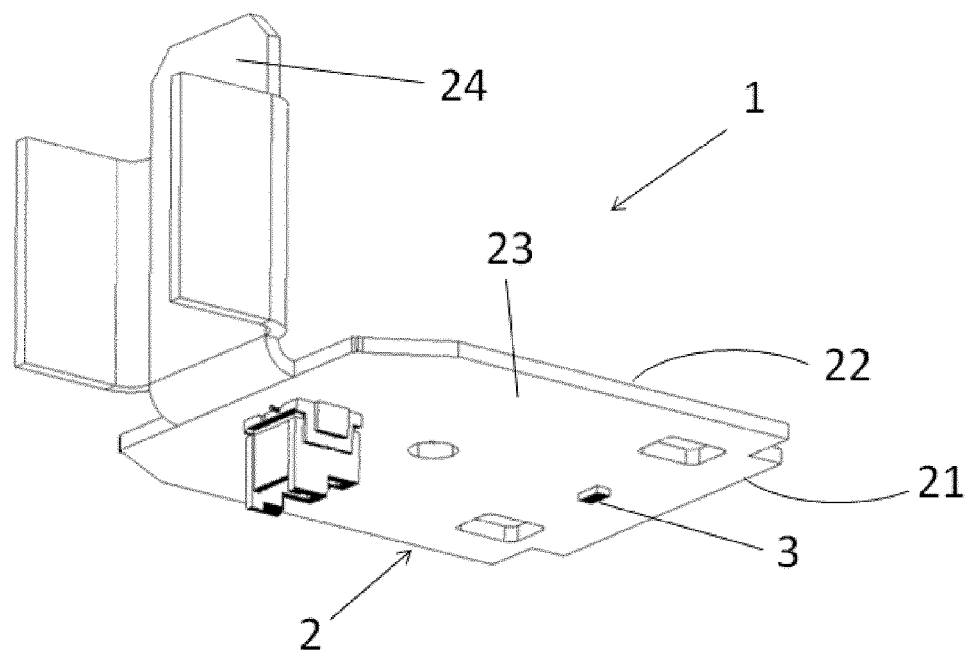
FIG. 2 shows a different embodiment of an electronic assembly according to the invention.

FIG. 2 shows an alternative embodiment of an electronic assembly 1 according to the invention. In this embodiment, the bending has been made such that the second side of the first main portion 23 is bent over the second side of the second main portion 24. The result is almost equivalent to the embodiment of FIG. 1 in terms of heat dissipation, and this embodiment presents some advantages and disadvantages depending on the manufacturing procedure.

When the electronic assembly is manufactured by first installing the LED and then bending the printed circuit board, it is easier to bend the electronic assembly as seen in the embodiment of FIG. 1, since a die is intended to press the concave face, and in this embodiment, this concave face does not comprise any element, so the die may press without any risk.

On the contrary, when the electronic assembly is first bent and then receives the LED, the embodiment of FIG. 2 is more suitable, since it is easier to place a LED on the concave side than in the convex side, due to the more favorable position of the printed circuit board when the LED is being installed.

Figure 3:
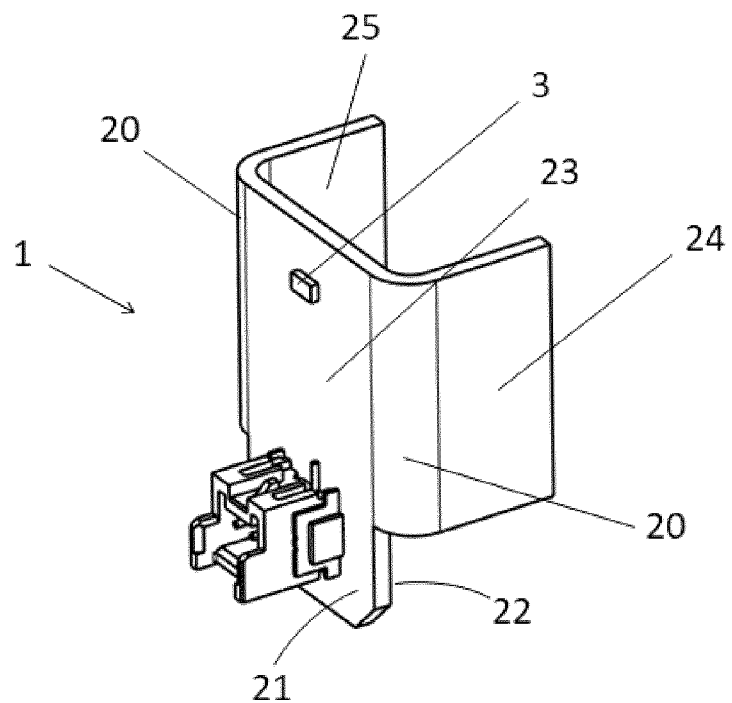
FIG. 3 shows a different embodiment of an electronic assembly according to the invention.

FIG. 3 shows a different embodiment. The clearest difference with respect to the embodiments shown in FIGS. 1 and 2 is the fact that the first main portion 23 comprises two first bending portions 20. As a consequence, the LED 3 stays in the first main portion 23 and there are two lateral portions 24, 25 which provide an alternative way for heat dissipation. As the skilled person may construe, there are embodiments where the first main portion comprises more than one first bending portion and the resulting second or third main portions may in turn comprise secondary bending portions, which could lead to a more complex structure.

Figure 4:
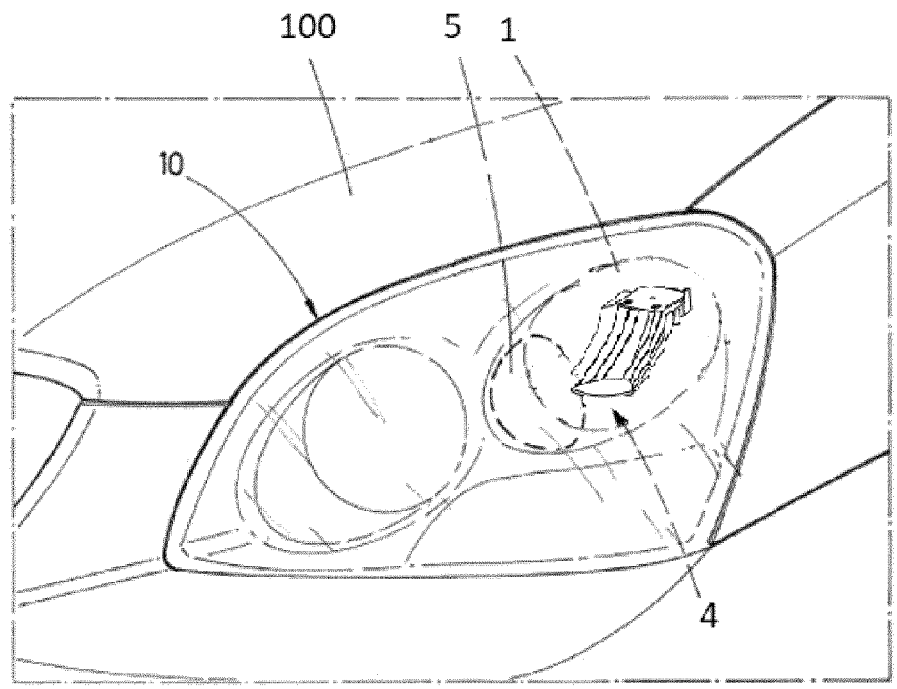
FIG. 4 shows a luminous device according to the invention installed in an automotive vehicle.

FIG. 4 shows an embodiment of an automotive luminous device 10 according to the invention installed in an automotive vehicle 100.

This automotive luminous device 10 comprises an electronic assembly 1 according to the embodiment of FIG. 1 and a reflector 4 arranged to receive light from the LED 3 and to shape the light into a light pattern projected outside the luminous device. A projecting lens 5 is also arranged to project light received by the reflector 4.

As may be seen in this figure, the printed circuit board supports the reflector. However, in the case of different optical elements, such as light guides, collimator or lenses, the optical element itself could support the printed circuit board.

What is claimed is:

1. An Electronic assembly comprising
a printed circuit board with a first side and a second side opposite the first side wherein the second main portion further comprises at least a second bending portion, which divides the second main portion into at least two secondary portions; and
an electronic component installed along the first side of the printed circuit board;
wherein the printed circuit board is an insulated metal substrate and comprises a first bending portion, which divides the printed circuit board into a first main portion and a second main portion;
the electronic component located on the first main portion;
wherein the second main portion further comprises at least a second bending portion, which divides the second main portion into at least two secondary portions; and
wherein the first and second main portions are each oriented outside a common plane; wherein the printed circuit board comprises conductive tracks which are arranged only within the first main portion of the printed circuit board and not in the first bending portion or in the second main portion.

2. The Electronic assembly according to claim 1, wherein the electronic component is a semiconductor light source, such as a light emitting diode (LED).

3. The Electronic assembly according to claim 1, wherein the first bending portion is such that the first side of the first main portion is bent over the first side of the second main portion.

4. The Electronic assembly according to claim 1, wherein each of the first main and second main portions form an angle between 80 and 100 degrees.

5. The Electronic assembly according to claim 1, wherein the second bending portion joins at least four sides of adjacent secondary portions.

6. The Electronic assembly according to claim 1, wherein two of the secondary portions form an angle between 80 and 100 degrees.

7. The Electronic assembly according to claim 1, wherein the first main portion comprises more than one first bending portion, in such a way that, further from a first main portion and a second main portion, a third or more main portions are adaptably created.

8. The Electronic assembly according to claim 1, wherein the first bending portion or one of the second bending portions has a radius of curvature which is greater than the thickness of the printed circuit board in the corresponding bending portion.

9. The Electronic assembly according to claim 1, a groove is provided in at least one bending portion, where the groove is substantially parallel to an elongation direction of the associated bending portion.

10. The Electronic assembly according to claim 1, wherein the printed circuit board comprises a core made of a metal substantially including a copper or aluminium material.

11. The Electronic assembly according to claim 1, wherein the printed circuit board is black, either because one of its components is black or because it has been painted or anodized to acquire a black color.

12. An Automotive luminous device comprising
an electronic assembly according to claim 1, wherein the electronic component is a semiconductor light source incorporating a light emitting diode (LED); and
a first optical element arranged to receive light from the semiconductor light source and to shape the light into a light pattern projected outside the luminous device.

13. The Automotive luminous device according to claim 12, wherein the optical element is at least one of a lens, a light guide, a reflector or a collimator.

14. An electronic assembly comprising:
- a printed circuit board with a first and a second opposing sides; and
- an electronic component installed along the first side, wherein the printed circuit board includes an insulated metal substrate that comprises a first main portion and a second main portion joined by a first bending portion;
- wherein the second main portion is further subdivided by a number of secondary portions each joined by a second bending portion;
- where the electronic component and a number of conductive tracks of the printed circuit board are arranged along the first main portion and outside the bounds of either the first bending portion, the second bending portion or any secondary portions; and
- wherein the first and second main portions are each oriented outside a common plane relative to the first bending portion.

\* \* \* \* \*

UNITED STATES PATENT AND TRADEMARK OFFICE
CERTIFICATE OF CORRECTION

| | | |
|---|---|---|
| PATENT NO. | : 11,432,401 B2 | Page 1 of 1 |
| APPLICATION NO. | : 17/043572 | |
| DATED | : August 30, 2022 | |
| INVENTOR(S) | : Roldan et al. | |

It is certified that error appears in the above-identified patent and that said Letters Patent is hereby corrected as shown below:

In the Claims

In Column 5, please amend Claim 1 Line 67 to read:
"opposite the first side wherein a second main portion"

In Column 6, please amend Claim 7 Lines 41-42 to read:
"portion, in such a way that, further from the first main portion and the second main portion, a third or more main portions are"

In Column 6, please amend Claim 8 Lines 46-47 to read:
"portions has a radius of curvature which is greater than a thickness of the printed circuit board in a corresponding"

In Column 6, please amend Claim 11 Lines 59-60 to read:
"of a number of components of the printed circuit board is black or because the printed circuit board has been painted or"

In Column 6, please amend Claim 12 Line 67 to read:
"a light pattern projected outside the automotive luminous device."

In Column 7, please amend Claim 14 Line 16 to read:
"along the first main portion and outside a bounds of"

Signed and Sealed this
First Day of November, 2022

*Katherine Kelly Vidal*

Katherine Kelly Vidal
*Director of the United States Patent and Trademark Office*